(12) United States Patent
Chih et al.

(10) Patent No.: US 7,215,583 B2
(45) Date of Patent: May 8, 2007

(54) CIRCUIT FOR INHIBITION OF PROGRAM DISTURBANCE IN MEMORY DEVICES

(75) Inventors: Yue-Der Chih, Hsin-Chu (TW); Shang-Hsuan Liu, Jhudong Township, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 98 days.

(21) Appl. No.: 11/204,477

(22) Filed: Aug. 16, 2005

(65) Prior Publication Data

US 2007/0041244 A1    Feb. 22, 2007

(51) Int. Cl.
G11C 7/00 (2006.01)
(52) U.S. Cl. .............................. 365/189.11; 365/185.21
(58) Field of Classification Search ........... 365/189.11, 365/185.21, 185.25
See application file for complete search history.

(56) References Cited

U.S. PATENT DOCUMENTS

| | | | | |
|---|---|---|---|---|
| 5,995,423 A | * | 11/1999 | Lakhani et al. | 365/200 |
| 6,128,221 A | | 10/2000 | Chih | 365/185.18 |
| 7,110,308 B2 | * | 9/2006 | Wang | 365/189.11 |
| 2004/0218422 A1 | * | 11/2004 | Nguyen et al. | 365/185.21 |

* cited by examiner

*Primary Examiner*—Anh Phung
(74) *Attorney, Agent, or Firm*—K & L Gates LLP

(57) ABSTRACT

A method and system is disclosed for prohibiting program disturbance in a memory array device. The system comprises a bit-line decoder coupled to each bit-line of the memory array for providing a predetermined current diverting path, a biased resistance module placed on the bit-line of the flash memory array through which a pull-up current provided by a predetermined power supply is diverted by the bit-line decoder when a cell of the flash memory array connecting to the bit-line is programmed. The programming current of the cell of the flash memory array is stabilized due to the diverted pull-up current.

18 Claims, 3 Drawing Sheets

CIRCUIT FOR INHIBITION OF PROGRAM DISTURBANCE IN MEMORY DEVICES

BACKGROUND

The present invention relates generally to an integrated circuit design, and more particularly to a system for inhibiting programming current disturbance that may occur during programming of a memory device.

In recent years, flash memory has become one of the most popular choices of read-only memories (ROM) available in the market mainly because of its capability of allowing easy and fast permanent data storage for devices such as computers, digital cameras, and many other portable devices. While other storage methods such as hard drives and random-access memory (RAM) are still used, flash memory can provide users with the best of both worlds. Flash memory is considered a solid state device, meaning that there are no moving parts within the memory module. This feature allows flash memory to provide a user with a quicker and more reliable way of storage, especially in environmental conditions where moving parts are prone to mechanical errors. Flash memory is also non-volatile, which means that the programmed state can be maintained without the need of a continuously supplied power. This allows the user to write data into the memory cells permanently, a feature that is absent in RAM.

It is well-known in flash array designs that cells share a common source region or a common source line in a group. During the programming process of a flash memory array with a stacked gate design, a memory cell that is to be programmed is selected with the corresponding bit-line and the corresponding word-line. A programming voltage is applied to a common source line and a selecting voltage is applied to a word-line such that the selected cell can be programmed with the designed state. However, the unselected cells, which are supposed to maintain their original state without the influence of the programming process, are found to be easily disturbed within the conventional configurations. During the programming of the selected cell, the source of the selected cell has a high programming voltage, thereby creating a large voltage difference for the neighboring cells. The voltage difference is large enough to cause "punch-through" disturbance to the other unselected memory cells. When the threshold voltage of the neighboring cell that is connected on the same selected bit-line is lower than the threshold voltage of the selected memory cell that is to be programmed in the bit-line, "punch-through" may be made worse, i.e., there may be hot electrons available to program an inhibited, erased memory cell from the unselected word-line. Similarly, when the threshold voltage of the selected memory cell is higher than the threshold voltage of the neighboring cell that is coupled to the same word-line, there may be hot electrons available to program an inhibited, erased memory cell from the neighboring, unselected bit-line (also known as program-FF disturbance). With the continuous narrowing down of the cell size and the operating voltage of the flash memory cells, the flash memory cells being operated at low VDD are found to seriously suffer the harm of programming or writing disturbance.

A commonly practiced conventional solution is to pull-up the unselected bit-lines with a fixed pull-up current such that disturbances for the unselected memory cells can be reduced. However, current methods used for bit-line pull-up provide a programming current that is equal to the difference between the pull-down current and the pull-up current, thereby creating difficulties in controlling a large variation of programming voltage. This large variation in programming current can potentially lower yield.

It is therefore desirable to have a circuit design that can provide the necessary pull-up current for the unselected bit-line for reducing disturbances during programming without creating a large programming current variation.

SUMMARY

In view of the foregoing, this invention provides a system for inhibition of program disturbance without creating a variation issue for the programming current.

In one embodiment, a system comprises a bit-line decoder coupled to each bit-line of the memory array for providing a predetermined current diverting path, a biased resistance module placed on the bit-line of the flash memory array through which a pull-up current provided by a predetermined power supply is diverted by the bit-line decoder when a cell of the flash memory array connecting to the bit-line is programmed. The programming current of the cell of the flash memory array is stabilized due to the diverted pull-up current.

The construction and method of operation of the invention, however, together with additional objects and advantages thereof will be best understood from the following description of specific embodiments when read in connection with the accompanying drawings.

DESCRIPTION

The following provides a detailed description of a memory system for inhibiting program disturbance that may occur at neighboring memory cells of a memory cell during programming of the memory cell. It is understood that although a flash memory system is used for illustration purposes, other types of memory systems having similar problems can use the same mechanism to improve the performance.

Figure 1:
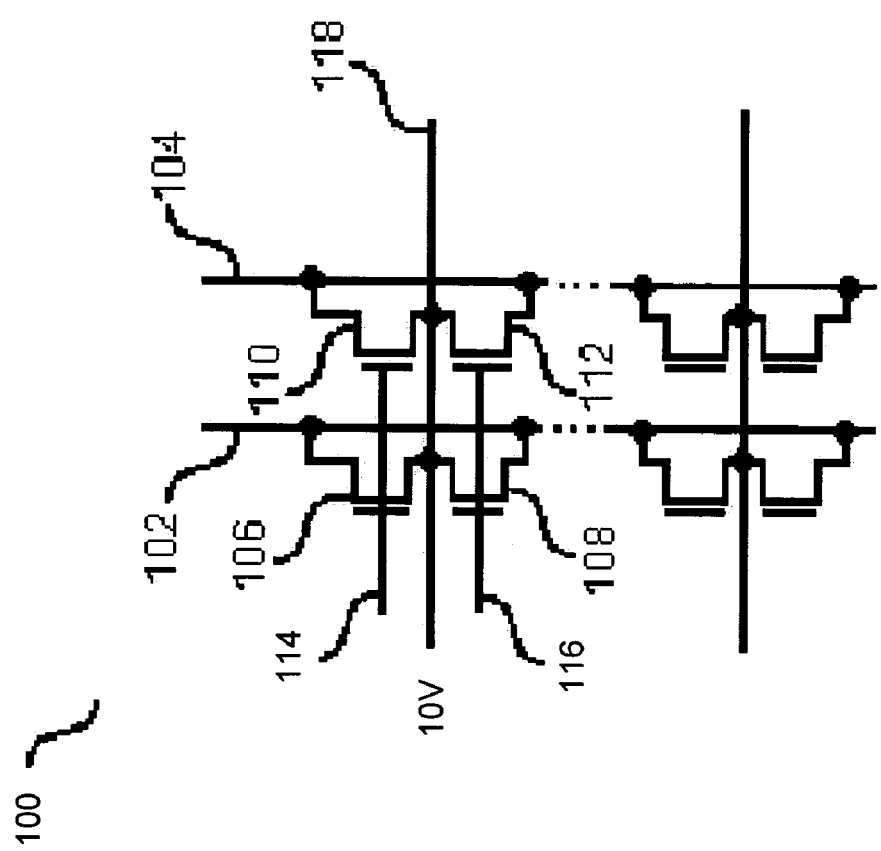
FIG. 1 illustrates a conventional circuit diagram with a flash memory.

FIG. 1 presents a circuit diagram 100 showing a section of a flash memory array where two bit-lines 102 and 104 provide the necessary column addresses for the selection of multiple neighboring flash memory cells. Each flash memory cell includes at least a transistor. Flash memory cells 106 and 108 are both coupled to, and share the bit-line 102, while flash memory cells 110 and 112 are both coupled to, and share the bit-line 104. A word-line 114 is coupled to the flash memory cells 106 and 110, while another word-line 116 is coupled to the flash memory cells 108 and 112 to provide the necessary row address for the selection of flash memory cell. A select line 118 is connected to the flash memory cells 106, 108, 110, and 112 to provide the necessary programming voltage required during the programming process.

When the flash memory cell 106 needs to be programmed to a desired state, a programming voltage is applied to the select line 118 while voltages are also applied at the bit-line 102 and the word-line 114 for locating the address of the flash memory cell 106. In the preferred embodiment, the select line 118 has a voltage of 10V. However, during the programming of the flash memory cell 106, different forms of disturbances may occur at unselected, neighboring flash memory cells 108, 110, and 112, which are supposed to maintain their original states without the influence of the programming process. For example, when the programming voltage is applied to the select line 118 and the voltage applied to the word-line 114 is above the threshold voltage (Vt) of the transistor of the flash memory cell 106, the flash memory cell 110 may suffer disturbance since the word-line 114 is also providing the voltage to a gate of the transistor within flash memory cell 110 while the select line 118 provides the programming voltage to the flash memory cell 110. With the connection to the select line 118, the source of the transistor in the flash memory cell 110 has a high programming voltage, such as 10V. The drain of the flash memory cell 110 is set at about VDD or about VDD-Vt. The source-to-drain voltage is about 10-VDD or (10-VDD+Vt) for the flash memory cell 110. A resulting voltage difference may be large enough to cause a form of disturbance to the flash memory cell 110 known as program-FF disturbance. Punch-through disturbance may also occur at the flash memory cell 108 during the programming of the flash memory cell 106 due to the close distance between the two flash memory cells. Furthermore, during the programming of the flash memory cell 106, another form of disturbance, known as reverse tunneling, may also occur to the flash memory cell 112 as current flows through silicon tunnels beneath the surface.

As the physical size of the flash memory cells becomes smaller and the operating voltage, or VDD, of the flash memory array is continually reduced, flash memory cells may greatly suffer from the harm of programming or writing disturbance. In order to prevent disturbances such as punch-through disturbance, the voltages at certain inputs such as the selected word-line and the unselected bit-line must be increased. For example, by boosting the voltage at the unselected bit-line, the margin for the flash memory cells 110 and 112 may be increased, which results in the reduction of the disturbance during the programming of the selected flash memory cell 106. For circuit diagram 100, a possible method for reducing or eliminating disturbances for the unselected flash memory cells 108, 110, and 112 is to increase the voltage of the selected bit-line 102 to approximately 0.8V before increasing the voltage of the selected word-line 114 to approximately 1.8V, and finally to increase the unselected bit-line 104 to approximately 2.5V. By raising these voltages, disturbances between the unselected flash memory cells can be reduced.

Figure 2:
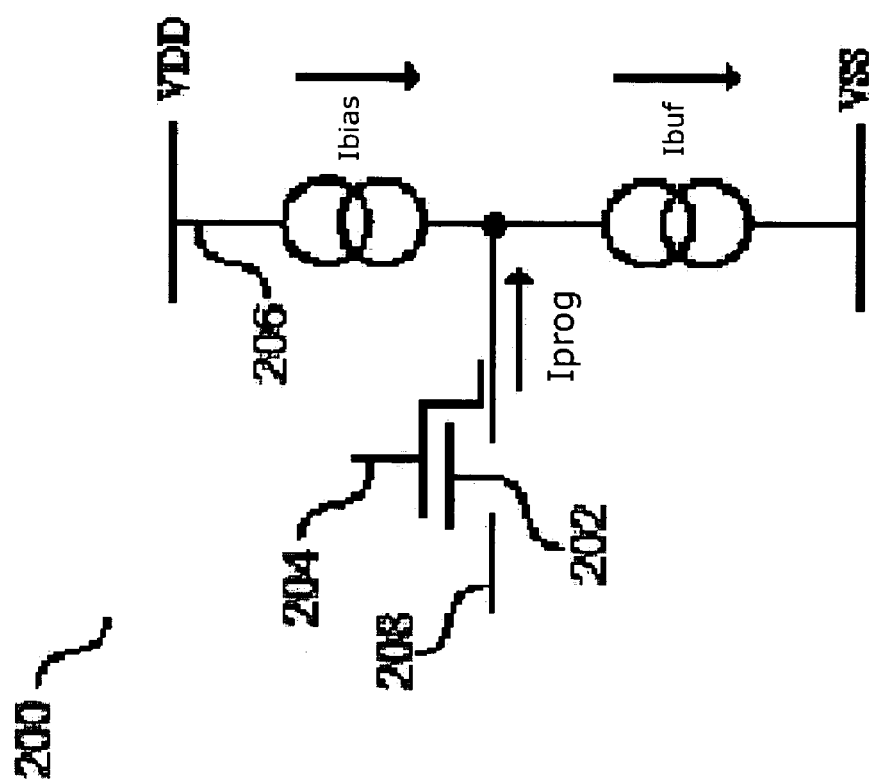
FIG. 2 illustrates a conventional circuit diagram for bit-line pull-up.

FIG. 2 presents a circuit diagram 200 illustrating a bit-line pull-up mechanism for reducing the disturbances on unselected flash memory cells during the programming of a selected flash memory cell. The flash memory cells are typically organized in an array formation. A specific flash memory cell can be selected with a row address, which is selected with a word-line signal, and a column address, which is selected with a bit-line signal. In the circuit diagram 200, only one flash memory cell 202 is shown coupled to a word-line 204, a bit-line 206, and a select line 208, which is also known as a source line.

During the programming of the flash memory cell 202, a programming voltage is applied to the select line 208 and a voltage is applied to the word-line 204. The bit-line 206 will be pulled up by VDD, thereby creating a certain level of programming current, $I_{prog}$, that is necessary for the programming of the flash memory cell 202. In a conventional bit-line pull-up mechanism, the programming current is determined by the numerical difference between a data input buffer current $I_{buf}$ and a bias current $I_{bias}$. However, the programming current may have a wide variation.

Figure 3:
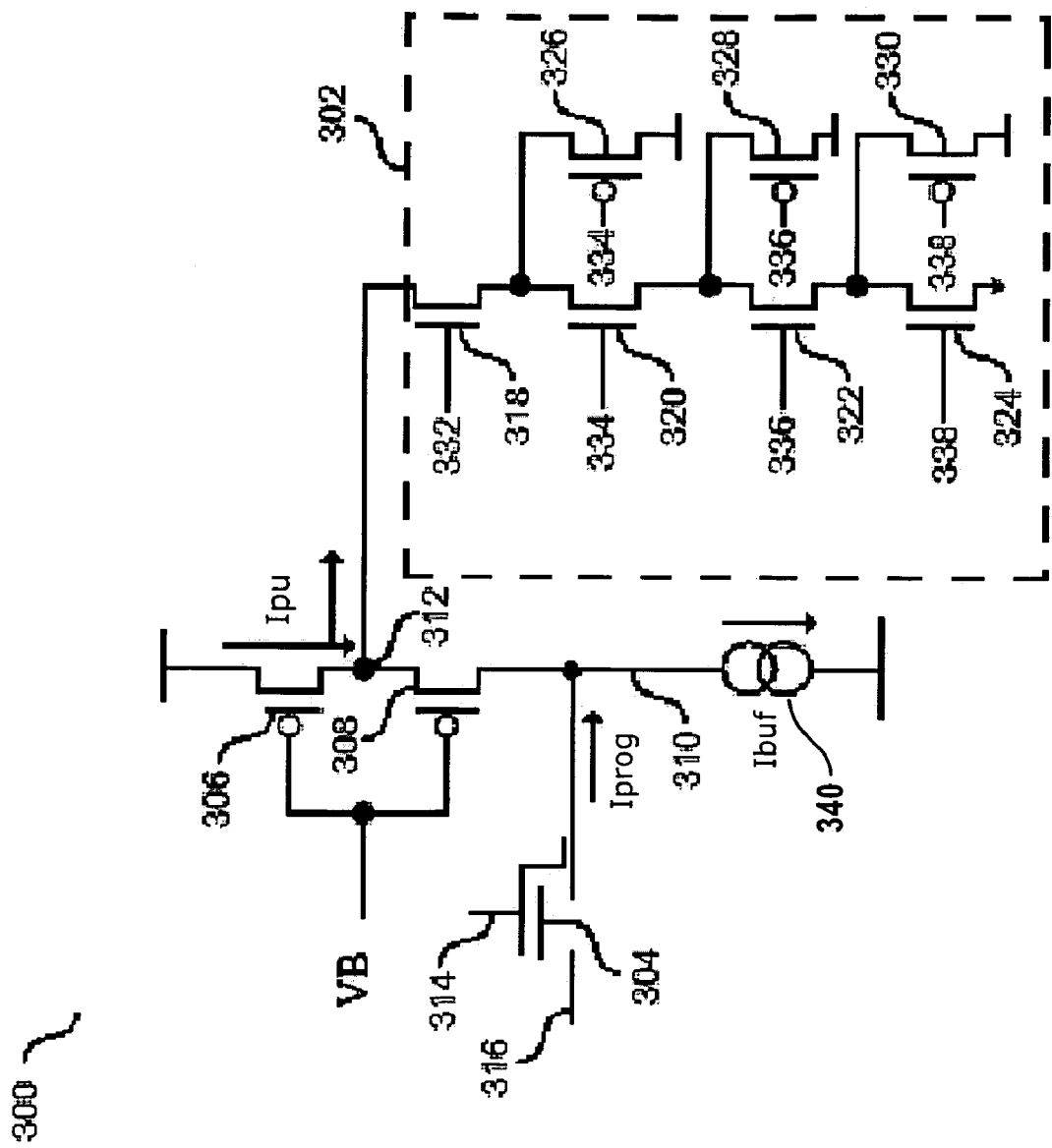
FIG. 3 illustrates a circuit diagram with a bit-line decoder in accordance with one embodiment of the present invention.

FIG. 3 presents a circuit diagram 300 with a bit-line decoder 302 for reducing the disturbance caused by the programming of a flash memory cell 304 in accordance with one embodiment of the present invention. A biased resistance module such as the serially connected PMOS transistors 306 and 308 is implemented on a bit-line 310. The PMOS transistors 306 and 308 are slightly turned on by a bias voltage VB to act as a biased resistance. The PMOS transistor 306 is coupled to the power supply source, e.g., VDD, and has a pull-up current going through it. The PMOS transistors 306 and 308 are further coupled to the bit-line decoder 302 through a coupling point 312. The bit-line decoder and the biased resistance module can be collectively viewed as a current regulated pull-up module as it basically asserts control over the pull-up current and uses a current diverting mechanism to maintain a regulated programming current.

The implementation of the bit-line decoder 302 provides both a necessary pull-up for the bit-line 310 for eliminating some disturbance caused to neighboring flash memory cells during the programming of the flash memory cell 304, and a better control of the programming current, $I_{prog}$. The flash memory cell 304 is connected to a word-line 314, the bit-line 310, and a select line 316. The word-line 314 and the bit-line 310 together activate the flash memory cell 304 based on an identified array address, while the select line 316 supplies the necessary programming voltage during the programming process. When the memory cell is selected as shown in FIG. 3, the pull-up current is consumed and directed through the coupling point 312 to the bit-line decoder 302. In this situation, the coupling point is pulled to a grounding voltage level such as VSS. As a result, the pull up current has no influence on the programming current, thereby reducing the programming current variation.

In this example, the bit-line decoder 302 has four NMOS transistors 318, 320, 322, and 324 and three PMOS transistors 326, 328, and 330. The serially connected NMOS transistors can be viewed as a current draining path for providing a negative compensation current while each PMOS can be viewed as a current providing path as additional current will be provided. The gates of the NMOS transistors 318, 320, 322, and 324 are respectively coupled to control signals 332, 334, 336, and 338. The gates of the PMOS transistors 326, 328, and 330 are respectively coupled to the control signals 334, 336, and 338. The source of each of the PMOS transistors 326, 328, and 330 is coupled to a power supply source.

In order to direct the pull-up current away from the bit-line 310 during the programming of the flash memory cell 304, a specific combination of the control signals 332, 334, 336, and 338 may be needed. The control signals 332, 334, 336 and 338 are decoding from the Y-address to select which pull-up current needs to be directed away from BL. In this example, the four NMOS transistors will be turned-on by the control signals 332, 334, 336 and 338 to direct the pull-up current away from the bit-line 310 during the programming of the flash memory cell 304. It is also understood that at least one of the NMOS transistors will be turned off when the BL is not selected. In this situation, the voltage of the coupling point 312 will be the supplied voltage VDD or Vboost, which is pulled by the PMOS transistors 326 or 328 or 330 and 306. The BL will be pulled at VDD or Vboost by the bias module to prevent the program disturb.

During the programming of the flash memory cell 304, a programming voltage is applied to the select line 316 and a voltage is applied to the word-line 314. Conventionally, the pull-up current together with the current from the bit-line decoder 302 directly impacts the programming current. But in the various embodiments of the present disclosure, the programming current can be shielded from the influence of the pull-up current by using the bit-line decoder 302 so that it stays at the same current level as the data input buffer current, $I_{buf}$ in a current source or a buffer module 340 situated between the grounding voltage level and the biased resistance module. By using the bit-line decoder 302 to divert the pull-up current for reducing the programming current variation, a much better control of the programming current is achieved. With better control of the programming current, better yield may also be achieved. It is further mentioned above that this bit-line pull-up mechanism is also suitable for bit-line boost.

When the memory cell is not selected for programming, the bit-line decoder 302 is turned off by applying appropriate voltage levels to the control signals 332, 334, 336, 338. No current diverting route is provided in this situation, and the pull-up current is provided along the bit-line. Because the pull-up current, the coupling node 312 is pulled to the level as the voltage supply (e.g., VDD or Vboost), and since the PMOS transistor 308 is also turned on, a high voltage level such as VDD is provided at the junction where the wordline and the bit-line meet. This would effectively prohibit the programming of the memory cell. If the bit-line has any leakage, the pull-up current can continue to compensate the leakage and keep the memory cell from being programmed.

The above illustration provides many different embodiments or embodiments for implementing different features of the invention. Specific embodiments of components and processes are described to help clarify the invention. These are, of course, merely embodiments and are not intended to limit the invention from that described in the claims. For example, the disclosed embodiments use a current diverting bit-line decoder, but any other current diverting mechanisms can be implemented for achieving the same result as long as the pull-up current is appropriately diverted to leave little influence on the programming current.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A flash memory array system comprising:
a biased resistance module placed on a bit-line through which a pull-up current is provided by a predetermined power supply;
a bit-line decoder coupled to the biased resistance module on each bit-line for diverting the pull-up current when needed;
at least one cell of the flash memory array connecting to the bit-line and having a programming current of the cell joining the bit-line,
wherein the pull-up current is fully diverted by the bit-line decoder so that the programming current of the cell is stabilized when programming the cell.

2. The system of claim 1 wherein the bit-line decoder further comprises at least one current path for diverting the pull-up current from the bit-line.

3. The system of claim 2 wherein the current path further includes one or more NMOS and PMOS transistors connected in series for diverting the pull-up current to a grounding voltage level.

4. The system of claim 3, wherein gates of the NMOS and PMOS transistor are controlled selectively for activating or deactivating corresponding transistors.

5. The system of claim 4, wherein each transistor is of a different physical size.

6. The system of claim 1, wherein the biased resistance module includes a pair of PMOS transistors coupled serially with the bit-line decoder diverting the pull-up current from a midpoint between the two transistors.

7. The system of claim 6 wherein gates of the PMOS transistors of the biased resistance module are coupled to a predetermined bias voltage to provide the pull-up current.

8. The system of claim 1 further comprising a current source coupled in series with and between the biased resistance module and a grounding voltage level.

9. A memory array system comprising:
at least one cell of the flash memory array connecting to a bit-line and having a programming current of the cell joining the bit-line;
a bit-line decoder for minimizing an influence of a pull-up current on the bit-line to the programming current; and
a buffer module coupled in series with and between a predetermined node where the programming current joins the bit-line and ground,
wherein the bit-line decoder is turned on to fully divert the pull-up current when programming the cell and the bit-line decoder is turned off to pull the predetermined node to a positive voltage supply level to prohibit programming the cell when not desired.

10. The system of claim 9, further comprising:
a biased resistance module placed on the bit-line through which a pull-up current provided by a predetermined power supply is diverted by the bit-line decoder when programming the cell and wherein the biased resistance module includes at least a pair of PMOS transistors with a midpoint between the two transistors coupled to the bit-line decoder.

11. The system of claim 10 wherein the bit-line decoder further comprises at least one current diverting path for diverting the pull-up current from the bit-line,
wherein the current diverting path further includes one or more NMOS and PMOS transistors connected in series for diverting the pull-up current to a grounding voltage level.

12. The system of claim 11, wherein gates of the NMOS and PMOS transistor are controlled selectively for activating or deactivating corresponding transistors.

13. A method for stabilizing a programming current of a memory array, the method comprising:
providing a pull-up current by a power supply source on a bit-line of the memory array;
selecting at least one cell of the flash memory cell to be programmed;
providing a programming current to at least one cell through which the programming current joins the bit-line at a predetermined node; and
fully diverting the pull-up current from the bit-line, wherein the diverted pull-up current does not influence the programming current of the cell of the memory array.

14. The method of claim 13, wherein the diverting of the pull-up current further includes:

providing one or more predetermined current diverting paths in a bit-line decoder coupled to the bit-line, wherein the bit-line has a biased resistance module placed thereon that includes at least a pair of transistors coupled serially and further coupled to the bit-line decoder at a midpoint between the two transistors.

15. The method of claim 14 wherein the midpoint between the two transistors is pulled to a grounding voltage level.

16. The method of claim 14 wherein the current diverting paths are formed by one or more transistors whose gates are selectively controlled for activating or deactivating corresponding transistors for providing the current diverting paths.

17. The method of claim 13 further comprising keeping the pull-up current without diverting the same when the cell is not selected for programming.

18. The method of claim 17 wherein the predetermined node is pulled to a positive power supply level when the cell is not selected for programming.

* * * * *